US010566434B2

(12) United States Patent
Hellings

(10) Patent No.: US 10,566,434 B2
(45) Date of Patent: Feb. 18, 2020

(54) CO-FABRICATED GATE-ALL-AROUND FIELD EFFECT TRANSISTOR AND FIN FIELD EFFECT TRANSISTOR

(71) Applicant: IMEC VZW, Leuven (BE)

(72) Inventor: Geert Hellings, Halle (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/853,136

(22) Filed: Dec. 22, 2017

(65) Prior Publication Data

US 2018/0233570 A1    Aug. 16, 2018

(30) Foreign Application Priority Data

Dec. 22, 2016 (EP) ..................................... 16206087

(51) Int. Cl.
*H01L 29/423*    (2006.01)
*H01L 21/3065*   (2006.01)
(Continued)

(52) U.S. Cl.
CPC .... *H01L 29/42392* (2013.01); *H01L 21/3065* (2013.01); *H01L 21/3086* (2013.01);
(Continued)

(58) Field of Classification Search
CPC ........... H01L 29/42392; H01L 21/3065; H01L 21/3086; H01L 21/823821;
(Continued)

(56) References Cited

U.S. PATENT DOCUMENTS 8,536,029 B1    9/2013   Chang et al.
9,153,647 B1   10/2015   Cheng et al.
(Continued)

OTHER PUBLICATIONS

European Patent Office Search Report for Application No. 16206087.5 dated Jul. 3, 2017 in 7 pages.

*Primary Examiner* — Peter Bradford
(74) *Attorney, Agent, or Firm* — Knobbe, Martens, Olson & Bear LLP

(57) ABSTRACT

The disclosed technology generally relates to semiconductor structures and methods of forming the semiconductor structures, and more particularly to semiconductor structures related to a gate-all-around field effect transistor and a fin field effect transistor. In one aspect, a method of forming field effect transistors includes forming in a first region of a substrate a first semiconductor feature and forming in a second region of the substrate a second semiconductor feature. Each of the first and second semiconductor features comprises a fin-shaped semiconductor feature including a vertical stack of at least a first semiconductor material layer and a second semiconductor material layer formed over the first semiconductor material layer. The method additionally includes selectively etching to remove the first semiconductor material layer along a longitudinal section of the first semiconductor feature to form a suspended longitudinal first semiconductor feature of a remaining second semiconductor material layer, while masking the second region to prevent etching of the second semiconductor feature. The method additionally includes forming a gate-all-around electrode surrounding the suspended longitudinal first semiconductor feature in the first region. The method further includes forming a gate electrode on the fin-shaped second semiconductor feature in the second region.

14 Claims, 8 Drawing Sheets

(51) Int. Cl.
  *H01L 21/308*   (2006.01)
  *H01L 21/8238*  (2006.01)
  *H01L 27/092*   (2006.01)
  *H01L 29/06*    (2006.01)
  *H01L 29/08*    (2006.01)
  *H01L 29/165*   (2006.01)
  *H01L 29/66*    (2006.01)
  *H01L 29/78*    (2006.01)
  *H01L 21/321*   (2006.01)

(52) U.S. Cl.
  CPC ........... *H01L 21/823821* (2013.01); *H01L 21/823828* (2013.01); *H01L 27/0924* (2013.01); *H01L 29/0673* (2013.01); *H01L 29/0847* (2013.01); *H01L 29/165* (2013.01); *H01L 29/66545* (2013.01); *H01L 29/7851* (2013.01); *H01L 21/3212* (2013.01)

(58) Field of Classification Search
  CPC ......... H01L 21/823828; H01L 27/0924; H01L 29/0673; H01L 29/0847; H01L 29/165; H01L 29/66545; H01L 29/7851; H01L 21/3212
  See application file for complete search history.

(56) References Cited

U.S. PATENT DOCUMENTS

| | | | |
|---|---|---|---|
| 9,230,989 B2 | | 1/2016 | Chang et al. |
| 9,698,251 B1* | | 7/2017 | Cheng ............... H01L 29/66795 |
| 10,074,575 B1* | | 9/2018 | Guillorn ............. H01L 29/0673 |
| 2013/0153993 A1 | | 6/2013 | Chang et al. |
| 2015/0041899 A1 | | 2/2015 | Yang et al. |
| 2015/0270348 A1 | | 9/2015 | Basker et al. |
| 2015/0372104 A1* | | 12/2015 | Liu ................... H01L 29/42364 |
| | | | 257/77 |
| 2016/0104705 A1 | | 4/2016 | Chung et al. |
| 2016/0111420 A1 | | 4/2016 | Zhang et al. |
| 2016/0204131 A1 | | 7/2016 | Cheng et al. |
| 2017/0018630 A1* | | 1/2017 | He .................... H01L 29/66818 |
| 2017/0133375 A1* | | 5/2017 | Fung ................. H01L 21/82382 |
| 2017/0154958 A1* | | 6/2017 | Fung ................... H01L 29/0673 |
| 2018/0151452 A1* | | 5/2018 | Doornbos ............. H01L 21/845 |
| 2018/0175163 A1* | | 6/2018 | Barraud ............ H01L 29/78654 |

* cited by examiner

CO-FABRICATED GATE-ALL-AROUND FIELD EFFECT TRANSISTOR AND FIN FIELD EFFECT TRANSISTOR

CROSS-REFERENCE TO RELATED APPLICATIONS

This application claims foreign priority to European Patent Application No. EP 16206087.5, filed on Dec. 22, 2016, content of which is incorporated by reference herein in its entirety.

BACKGROUND

Field

The disclosed technology generally relates to semiconductor structures and methods of forming the semiconductor structures, and more particularly to semiconductor structures related to a gate-all-around field effect transistor and a fin field effect transistor.

Description of the Related Technology

Fabrication of semiconductor structures or devices requires sophisticated processing technologies and methods. Many semiconductor devices include different types of components or subcomponents that serve different functions or purposes. To serve the different functions or purposes, the different components or subcomponents may have different performance specifications, e.g., different voltage or power specifications. Despite the differences, in some of these semiconductor devices, it may be advantageous to integrate the different components or subcomponents in a single semiconductor device or circuit. However, when combining different types of components in a single integrated device or circuit, the integrated device may generally subjected to a plurality of different processing schemes or semiconductor processes aimed at fabricating the different types of components on a common substrate.

In some complementary metal oxide semiconductor (CMOS) technology-based devices, different components that are integrated into a single semiconductor device or circuit may include core logic and input/output (I/O) devices. To fabricate the semiconductor device or circuit, the core logic and I/O devices may be fabricated side-by-side, e.g., on a single substrate, to form a common device or structure. However, different components or subcomponents such as core logic and I/O devices may face different scaling challenges. For example, downscaling of the core logic is commonly desired, e.g., in accordance with an empirical scaling trend known in the industry as Moore's Law, as such downscaling generally allows for an increased processing capability per unit area utilized and/or reduced energy consumption. Reduced physical dimensions of the core logic can also reduce the operating voltages. On the other hand, I/O devices fabricated side by side with the core logic generally has larger physical size to handle the higher operating voltages to fulfil their purpose e.g., driving I/O pins of the device. As a result, the I/O devices may not follow the same downscaling trend as the core logic devices. Thus, there is a need for process architectures and processing methods for integrating different types of components or subcomponents on the same substrate.

SUMMARY OF CERTAIN INVENTIVE ASPECTS

As realized by the inventor, there is a need for providing device and process architectures for fabricating different components or subcomponents, e.g., components or structures suitable for core logic and components or structures suitable for I/O functionality, on a common substrate.

It is a general objective of the disclosed technology to address the above needs, among other needs, in the industry. Further objectives and advantages of the disclosed technology may be understood from the following.

According to a first aspect of the disclosed technology there is provided a method of forming a gate-all-around field effect transistor, GAAFET, in a first region of a substrate and a fin field effect transistor, finFET, in a second region of the substrate, the first region including a first semiconductor feature and the second region including a second semiconductor feature, each of the semiconductor features being a fin-shaped semiconductor feature including a vertical stack of at least a first semiconductor material layer and a second semiconductor material layer arranged above the first semiconductor material layer, the method comprising: selectively removing the first semiconductor material layer along a longitudinal section of the first semiconductor feature by etching to form a suspended longitudinal first semiconductor feature of a remaining second semiconductor material layer, while masking the second region to counteract etching of the second semiconductor feature, and forming a gate-all-around electrode on the suspended longitudinal first semiconductor feature in the first region and a gate electrode on the fin-shaped second semiconductor feature in the second region.

By the disclosed technology, a gate-all-around field effect transistor, GAAFET, may be formed in a first region of a substrate and a fin field effect transistor, finFET, may be formed in a second region of a substrate.

The GAAFETs, due to their scalability and desirable short channel properties, are suitable for forming core logic devices for digital circuitry. Meanwhile, finFETs, provide scalability but supports higher drive currents than GAAFETs due to greater channel cross sections. FinFETs are thus suitable for providing I/O functionality.

By the disclosed technology the GAAFET and the finFET, may be formed using a plurality of common processing steps. The GAAFET and the finFET may both be formed starting from similar or like semiconductor features present in different regions of a substrate.

Preferably, the GAAFET and the finFET are fabricated from like semiconductor features present in a first and a second region of a substrate respectively. Advantageously each of fin-shaped semiconductor features in the first region and the second region may include a similarly arranged vertical stack (a same number of semiconductor material layers, a same fin height and a same fin width). The semiconductor features present in the first and the second region may however be differently shaped.

A plurality of fin-shaped semiconductor features including a vertical stack of at least a first semiconductor material layer and a second semiconductor material layer arranged above the first semiconductor material layer may be present in the first region and/or the second region. By this arrangement, a plurality of GAAFETs may be formed in the first region and/or in the second region in parallel.

A plurality of separate first regions may be present on the substrate. A plurality of separate second regions may be present on the substrate.

According to the disclosed technology, the first semiconductor material layer is selectively removed along a longitudinal section of the first semiconductor feature by etching to form a suspended longitudinal first semiconductor feature of the remaining second semiconductor material layer. Thus, the first semiconductor material layer may be removed from the second semiconductor material layer, such that a suspended or cantilever longitudinal first semiconductor feature is formed by the second semiconductor material layer. Thus formed suspended longitudinal first semiconductor feature is thus suspended along its length at a portion corresponding to the longitudinal section.

According to the disclosed technology, the first semiconductor material layer is selectively removed from a longitudinal section of the first semiconductor feature while masking the second region. By masking the second region etching of the second semiconductor feature at the second region may be counteracted. Any suitable masking technique may be used as long as the technique is capable of counteracting etching of the second region. Suitable techniques may include employment of oxide masks, positive or negative photoresist masks to give a few examples.

Further, any suitable technique for selectively removing the first semiconductor material by etching may be used. Methods of selectively removing the first semiconductor material may include, wet etching or dry etching to give a few examples.

As described above, a plurality of fin-shaped semiconductor features may be present in the first region and the second region respectively, meaning that a masking of the second region may simultaneously mask a plurality of fin-shaped semiconductor features present in the second region. Correspondingly, the first semiconductor material layer may be simultaneously selectively removed by etching at a plurality of fin-shaped semiconductor features present in the first region.

According to one embodiment the first semiconductor feature and the second semiconductor feature are arranged in a dielectric layer, a first sacrificial gate stack including a sacrificial gate and a sacrificial gate dielectric is arranged on the longitudinal section of the first semiconductor feature, and a second sacrificial gate stack including a sacrificial gate and a sacrificial gate dielectric are arranged on a longitudinal section of the second semiconductor feature, the method may further comprise: removing the sacrificial gate of the first sacrificial gate stack and the sacrificial gate of the second sacrificial gate stack, thereby forming a first and a second trench in the dielectric layer, the first trench exposing the sacrificial gate dielectric along the longitudinal section of the first semiconductor feature and the second trench exposing the sacrificial gate dielectric along the longitudinal section of the second semiconductor feature, removing the sacrificial gate dielectric in the first trench, thereby exposing the longitudinal section of the first semiconductor feature in the first trench, and selectively removing the first semiconductor material layer along the longitudinal section of the first semiconductor feature by etching in the first trench while masking the second region to counteract etching of the second semiconductor feature.

The inventive process may thereby be integrated in a replacement metal gate, RMG, processing scheme wherein the final gate stacks may be formed in the first and the second trenches and replace the respective sacrificial gate stacks.

The first sacrificial gate stack may be arranged to extend transverse to a longitudinal direction of the first fin-shaped semiconductor feature, across the longitudinal section thereof. The second sacrificial gate stack may be arranged to extend transverse to a longitudinal direction of the second fin-shaped semiconductor feature, across the longitudinal section thereof.

Subsequent to the trench formation, the sacrificial gate dielectric in the first trench may be removed such that the longitudinal section of first semiconductor feature in the first trench is exposed. In other words, the longitudinal section of the first semiconductor feature in the first trench may be laid bare in the sense that it may be directly accessed or reached and thus processed in the first trench.

A mask may be formed at the second trench to prevent etching of the sacrificial gate dielectric in the second trench during the removal of the sacrificial gate dielectric in the first trench.

The sacrificial gate dielectric present in the second trench and/or the mask at the second trench (if such a mask is formed and not removed prior to the removal step of the sacrificial gate dielectric in the first trench) may counteract or preferably prevent etching in the second trench, while etching may occur in the first trench.

It is thus possible to form different types of semiconductor devices at different regions on a substrate with few additional processing steps. In other words, the disclosed technology may easily be integrated in existing CMOS production processes.

According to an embodiment, the forming of the gate-all-around electrode on the suspended longitudinal first semiconductor feature may include depositing a first gate conductor in the first trench and the forming of the gate electrode on the fin-shaped second semiconductor feature may include depositing a second gate conductor in the second trench.

The gate electrodes thus formed may part of respective final gate stacks. The depositing of the first gate conductor and the second gate conductor may include depositing one or more metal layers in the first trench and the second trench. Forming a gate conductor by a single metal-including layer may simplify the overall process. Forming a gate conductor by more than one metal-including layers may provide improved flexibility in obtaining a gate conductor with desired process properties and/or electrical properties.

The first gate conductor may be different form the second gate conductor, or the first gate conductor and the second gate conductor may be of the same type. In other words, the first gate conductor and the second gate conductor may be formed simultaneously using the same material or materials, or the first gate conductor and the second gate conductor may be formed separately using different materials, different thicknesses, different number of layers etcetera.

According to an embodiment the method may further comprise, subsequent to forming the suspended longitudinal first semiconductor feature in the first trench, removing the sacrificial gate dielectric in the second trench. The longitudinal section of the second semiconductor feature in the second trench may thus be exposed.

According to an embodiment the method may further comprise, prior to forming the gate electrodes, depositing a gate dielectric in the first trench on the longitudinal section of the suspended longitudinal first semiconductor feature. The suspended longitudinal first semiconductor feature of the first semiconductor feature in the first trench may thus be covered by the deposited gate dielectric. The gate dielectric may be deposited as a conformal layer around the longitudinal section of the suspended first semiconductor feature.

According to an embodiment the method may further comprise, prior to forming the gate electrodes, depositing a gate dielectric in the second trench on the longitudinal section of the second semiconductor feature. By this arrangement, a different gate dielectric or dielectric fulfilling specific requirements may be formed directly on the longitudinal section of the second semiconductor feature in the second trench, which is advantageous in that the properties of the gate stack may be tailored.

According to an embodiment, the first semiconductor feature and the second semiconductor feature may be arranged in a dielectric layer, a first sacrificial gate stack may be arranged on the longitudinal section of the first semiconductor feature, and wherein a second sacrificial gate stack may be arranged on a longitudinal section of the second semiconductor feature, the method may further comprise: removing the first and second sacrificial gate stacks, thereby forming a first trench and a second trench in the dielectric layer exposing the longitudinal sections of the first and second semiconductor features, respectively, forming a mask above the second trench, and selectively removing the first semiconductor material along the longitudinal section of the first semiconductor feature by etching in the first trench while the mask above the second trench acts as an etch mask for the longitudinal section of the second semiconductor feature.

The method may thereby, based on a corresponding rationale as given above, be efficiently integrated in a replacement metal gate (RMG) processing scheme.

The first sacrificial gate stack may be arranged to extend transverse to a longitudinal direction of the first fin-shaped semiconductor feature, across the longitudinal section thereof. The second sacrificial gate stack may be arranged to extend transverse to a longitudinal direction of the second fin-shaped semiconductor feature, across the longitudinal section thereof.

By exposing the longitudinal sections of the first and second semiconductor features in the trenches, the longitudinal sections of the first and second semiconductor features may be uncovered and may be laid bare in the sense that they may be directly accessed or reached and thus be processed in the first and second trench in later process steps, respectively.

By forming the mask above the second trench, the second trench may however be sealed in the sense that the interior of the second trench is no longer exposed. Hence, by forming a mask above the second trench, the second trench may be protected from processing taking place at e.g. the first trench or any other location at the substrate, such that the processing in the second trench is counteracted or preferably prevented. It is to be noted that the mask may fill or partially fill the second trench. The mask should however completely cover the second semiconductor feature along the longitudinal section thereof.

During the etching in the first trench the mask above the second trench may accordingly act as an etch mask for the longitudinal section of the second semiconductor feature. In other words, the mask present above or in the second trench may counteract or preferably prevent etching in the second trench, while etching may occur in the first trench.

It is thus possible to form different types of semiconductor devices at different regions on a substrate with few additional processing steps. In other words, the disclosed technology may easily be integrated in existing CMOS production processes.

The forming of the gate-all-around electrode on the suspended longitudinal first semiconductor feature may include depositing a first gate conductor in the first trench. Forming the gate electrode on the fin-shaped second semiconductor feature may include depositing a second gate conductor in the second trench.

Removing the first and the second sacrificial gate stacks may include removing a sacrificial gate and a sacrificial dielectric of the first sacrificial gate stack and the second sacrificial gate stack, respectively.

The method may comprise, prior to forming the gate electrodes, depositing a gate dielectric in the first trench on the longitudinal section of the suspended longitudinal first semiconductor feature and depositing a gate dielectric in the second trench on the longitudinal section of the second semiconductor feature.

According to an embodiment, the first semiconductor material may be a SiGe-based material and the second semiconductor material may be a Si-based material.

According to an embodiment, the first semiconductor material may be a Si-based material and the second semiconductor material may be a SiGe-based material.

By employing Si-based and SiGe-based materials for the first and second semiconductor materials GAAFETs and finFETs having desirable electrical properties may be formed. Hence, GAAFETs having desired short-channel characteristics may be formed side by side with finFETs having desirable channel characteristics. Furthermore, etch processes with good selectivity between Si and SiGe are available.

The method may further comprise forming of source and drain electrodes on source drain regions of the first semiconductor feature in the first region. The source region and the drain region may be formed on mutually opposite sides of the longitudinal section of the first semiconductor feature. The source electrode and the drain electrode may be formed on mutually opposite sides of the gate-all-around electrode of the suspended longitudinal first semiconductor feature.

The method may further comprise forming of source and drain electrodes on source drain regions of the second semiconductor feature in the second region. The source region and the drain region may be formed on mutually opposite sides of the gate electrode formed on the fin-shaped second semiconductor feature. The source electrode and the drain electrode may be formed on mutually opposite sides of the gate electrode formed on the fin-shaped second semiconductor feature.

According to a second aspect of the disclosed technology there is provided a semiconductor structure comprising: a substrate, at least one semiconductor device arranged at a first region of the substrate and at least one semiconductor device) arranged at a second region of the substrate, wherein the at least one semiconductor device arranged at the first region comprises at least one first semiconductor feature of a second semiconductor material, and a gate-all-around stack including a gate dielectric and a first gate conductor arranged on the first semiconductor feature, and the at least one semiconductor device arranged at the second region comprises at least one fin-shaped semiconductor feature including a vertical stack of at least a first semiconductor material layer and a second semiconductor material layer arranged above the first semiconductor material layer, and a gate stack including a gate dielectric and a second gate conductor arranged on the at least one fin-shaped semiconductor feature.

The presence of at least one semiconductor device arranged at a first region of the substrate and at least one semiconductor device arranged at a second region of the substrate makes it possible to form the respective devices of the structure using the method of the first aspect. The virtues of a structure obtained by the method discussed above apply correspondingly to the second aspect and will therefore not be repeated here. Likewise, the various discussions details regarding corresponding features of the method of the first aspect and embodiments thereof apply correspondingly to the second aspect wherefore reference is made to the above.

It is to be understood that the terminology used herein is for purpose of describing particular embodiments only, and is not intended to be limiting. It must be noted that, as used in the specification and the appended claim, the articles "a," "an," "the," and "the" are intended to mean that there are one or more of the elements unless the context clearly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

The above, as well as additional objects, features and advantages of the disclosed technology, will be better understood through the following illustrative and non-limiting detailed description of preferred embodiments of the disclosed technology, with reference to the appended drawings. In the drawings like reference numerals will be used for like elements unless stated otherwise.

FIG. 1A is a perspective section view of a substrate having a first region including a first semiconductor feature and the second region including a second semiconductor feature.

FIGS. 1B-1F are plane section views of the substrate of FIG. 1, taken along the front section of FIG. 1A at various stages of the method.

As illustrated in the figures, the sizes of layers and regions are exaggerated for illustrative purposes and, thus, are provided to illustrate the general structures of embodiments of the present invention. The figures should not be considered limiting the invention to the specific embodiment; instead they are used for explaining and understanding the invention.

DETAILED DESCRIPTION OF CERTAIN ILLUSTRATIVE EMBODIMENTS

A method of forming a gate-all-around field effect transistor, GAAFET, in a first region of a substrate and a fin field effect transistor, finFET, in a second region of a substrate will now be described with reference to the drawings.

Figure 1A:
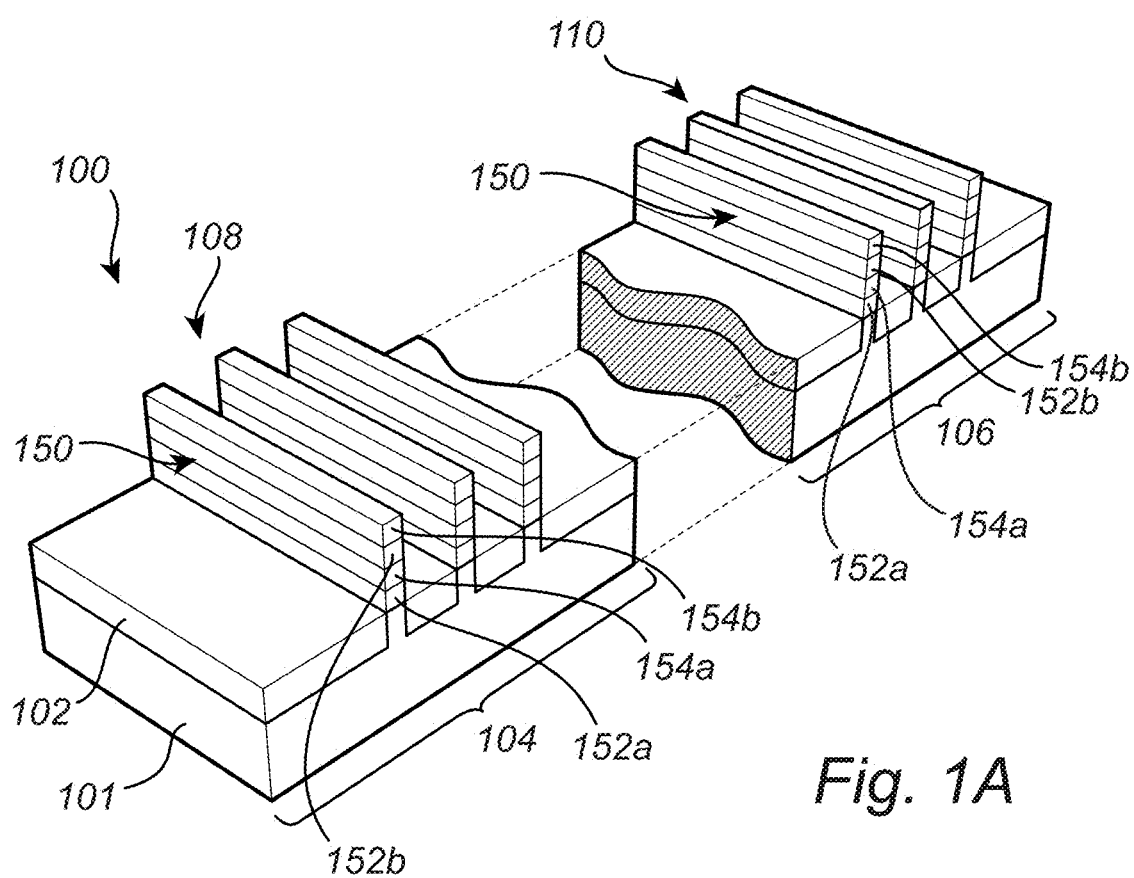
FIGS. 1A-1F illustrate intermediate structures at various stages of fabricating a gate-all-around field effect transistor (GAAFET) in a first region of a substrate and a fin field effect transistor (finFET) in a second region of a substrate, according to embodiments.

FIG. 1A shows a perspective view of a section of a semiconductor structure 100, which is an intermediate structure during fabrication of a semiconductor device, according to embodiments. The structure 100 may extend laterally/horizontally beyond the illustrated section. The front face/plane of section through the structure 100 is common to all of the figures, although FIGS. 1B-1F and FIG. 2A-2B are plane section views.

The semiconductor structure 100 of FIG. 1A includes a first region 104 and a second region 106. The first region 104 and the second region 106 may be adjacent to each other or arranged at different distances from each other. The first region 104 and the second region 106 are, however, arranged on a common substrate 101.

A first set of semiconductor features 108 and a second set of semiconductor features 110 are formed on a main surface of the substrate 101. The semiconductor features of the first set 108 extend in parallel to each other. The semiconductor features of the second set 110 extend in parallel to each other. The semiconductor features of the first set 108 also extend in parallel to the semiconductor features of the second set 110, in the illustrated embodiment of FIG. 1A. However, embodiments are not so limited, and in some other embodiments, different relative orientations between the semiconductor features of the first set 108 and the semiconductor features of the second set 110 are possible.

Each semiconductor feature of the first and the second set 108, 110 is formed to be elongated and may be described as presenting a "fin" shape and will accordingly be referred to as such in the following.

For illustrative purposes, in FIG. 1A, each of the first set of fins 108 and the second set of fins 110 include three fins. However, the method is generally applicable to structures with fewer or greater number of fins in each set. The number of fins of the first set 108 and the second set 110 need not even be the same.

In FIG. 1A, each fin of the first set of fins 108 and the second set of fins 110 include a vertical stack 150 of a plurality of layers, according to embodiments. In the illustrated embodiment, each of the fins has four layers 152a, 152b, 154a, 154b. More specifically two layers 152a, 152b of a first semiconductor material and two layers 154a, 154b of a second semiconductor material are included in the stack 150 of FIG. 1A. However, embodiments are not so limited and the vertical stack 150 may include a different number of layers 152a, 152b, 154a, 154b, for instance two layers (a second semiconductor material layer arranged on a first semiconductor material layer), three layers (a first semiconductor material layer arranged between a pair of second semiconductor material layers) or four or more layers (an alternating sequence of a first semiconductor material layer and a second semiconductor material layer). Further, the fins in the respective sets of semiconductor features 108, 110 may even include different numbers of layers in the respective vertical stacks 150.

The semiconductor material layers 152a, 152b may be formed of a first semiconductor material, e.g., silicon germanium (SiGe) or a SiGe-based material, and the semiconductor material layers 154a, 154b may be formed of a second semiconductor material, e.g., silicon (Si) or a Si-based material. In the depicted structure 100 of FIG. 1A, the semiconductor material layers 152a, 152b are formed of SiGe and the semiconductor material layers 154a, 154b are formed of Si. However, the semiconductor material layers 152a, 152b may also be made of Si and the semiconductor material layers 154a, 154b may be made of SiGe. Other materials may also be selected for the layers 152a, 152b, 154a, 154b of the vertical stack 150.

As will be described below, in later stages of the method, a GAAFET device may be formed in the first region 104 and a finFET may be formed in the second region 106. Moreover, as also will be described below, in later stages of the method, a n-type GAAFET or a p-type GAAFET may be formed in the first region 104 depending on whether the material layers 152a, 152b of SiGe or the material layers 154a, 154b of Si are selectively removed by etching. Etching of SiGe will result in a n-type GAAFET, whereas etching of Si will result in a p-type GAAFET. The material layers 152a, 152b of SiGe may hence form p-channels and the material layers 154a, 154b of Si may hence form n-channels.

The substrate 101 may be a semiconductor substrate. The substrate may for instance be a silicon, Si, substrate. The substrate 101 may also be a germanium, Ge, substrate, a silicon germanium, SiGe, substrate, a silicon carbide, SiC, substrate, a silicon on insulator, SOI, substrate, a silicon on glass substrate, a silicon on sapphire substrate, a germanium on insulator substrate, a gallium arsenide, GaAs, substrate, a gallium arsenide phosphide, GaAsPh, substrate, an indium gallium arsenide, InGaAs, substrate, an indium phosphide, InP, substrate, or a gallium nitride, GaN, substrate. The substrate 101 may further be a stack of thin layers of two or more of the aforementioned semiconductors.

The first set of fins 108 and the second set of fins 110 may be formed by a combination of suitable deposition and patterning processes. For instance, a vertical stack of two or more blanket layers of the first semiconductor material and the second semiconductor material may be epitaxially grown on the substrate 101. The fins may be formed by lithography followed by etching of the stack to obtain fins of desired shape and dimensions. Shallow trench isolation (STI) regions 102 may be formed between the fins of each of the first set 108 and the second set 110. By way of example, the fins of the first set 108 and the second set 110 may be formed with a height above the main surface of the substrate 101 of 10-100 nm. A separation between the fins 108, 110 within each set may be on the order of tens of nanometers.

Figure 1B:
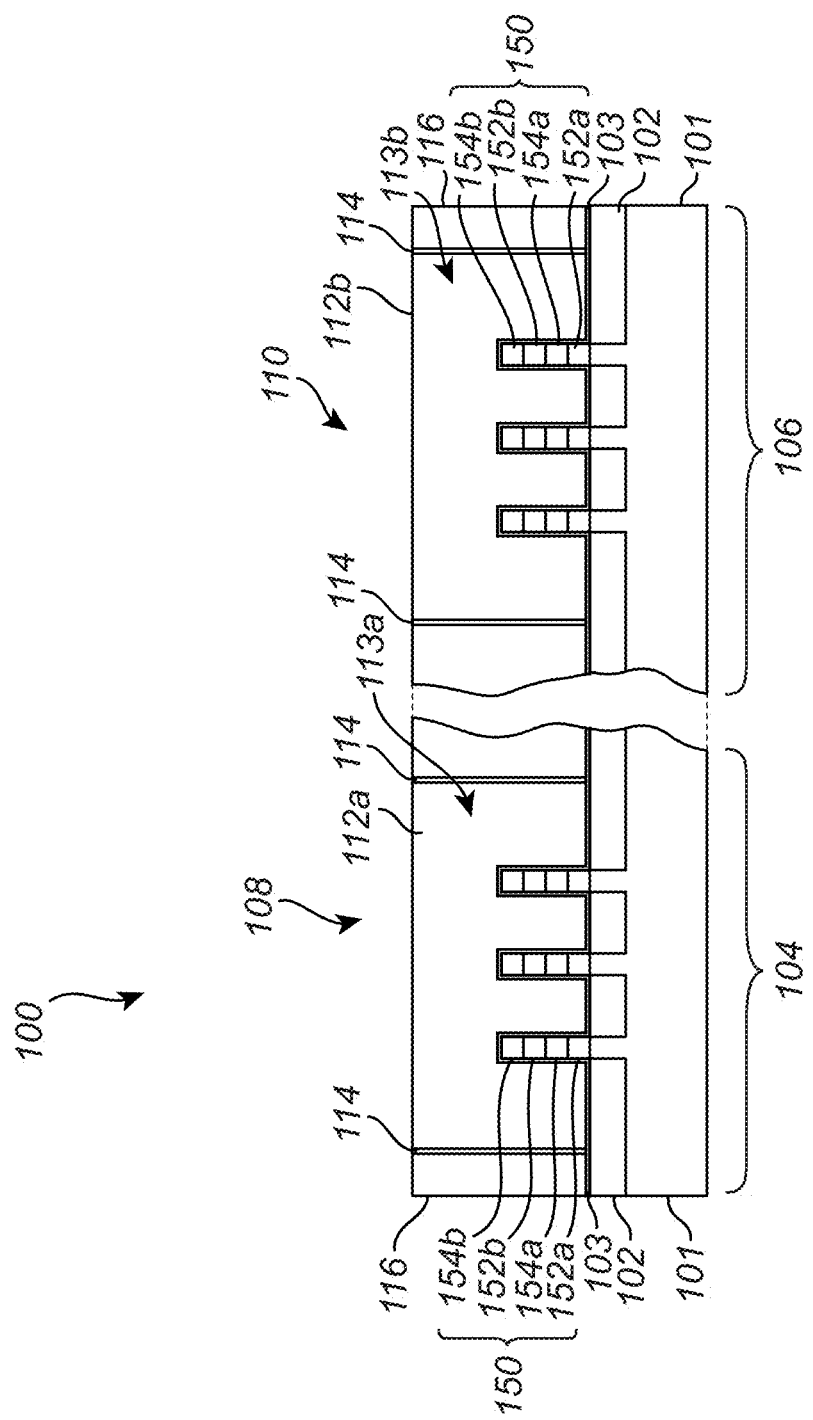

Now referring to FIG. 1B, here is conceptually depicted the structure 100 of FIG. 1A as a cross section corresponding to the front face of the perspective cross sectional view of FIG. 1A.

In FIG. 1B a sacrificial gate dielectric 103 has been formed on the first set of fins 108 and the second set of fins 110. The sacrificial gate dielectric 103 may be formed of, for instance, silicon oxide ($SiO_2$) or silicon oxynitride ($SiO_xN_y$). A layer of $SiO_2$ or $SiO_xN_y$ may be formed, e.g., deposited or grown, using a suitable process to cover the first region 104 and the second region 106 of the substrate 101 and the first set of fins 108 and the second set of fins 110.

Further, in FIG. 1B, a first sacrificial gate 112a has been formed in the first region 104 and a second sacrificial gate 112b has been formed in the second region 106. The first sacrificial gate 112a extends across the fins of the first set 108 and the second sacrificial gate 112b extends across the fins of the second set 110. In the figures, the cross section is oriented and positioned such that it extends along the sacrificial gates 112a, 112b, i.e., across the material 112a, 112b of the sacrificial gates 112a, 112b. The first sacrificial gate 112a forms together with the sacrificial gate dielectric 103 formed on the first set of fins 108 a first sacrificial gate stack. The second sacrificial gate 112b forms together with the sacrificial gate dielectric 103 formed on the second set of fins 110 a second sacrificial gate stack.

The sacrificial gate material 112a, 112b may be formed using a suitable process, e.g., by depositing a polysilicon layer or an amorphous silicon material layer to cover the first region 104 and the second region 106 of the substrate 101 and the first set of fins 108 and the second set of fins 110, and subsequently patterning and etching the polysilicon layer or amorphous silicon material layer to form the sacrificial gates stacks with desired dimensions and positions. For instance, a fluorine- or chloride based etchant may be used in a wet-etch process or a dry-etch process such as reactive ion etching (RIE).

A spacer layer 114 may optionally be formed on the sidewalls of the sacrificial gates 112a, 112b. The spacer layer 114 may be formed by an insulating material such as $SiO_2$, silicon nitride (e.g. SiN or $Si_3N_4$), silicon oxynitride, SiON, or a low-K dielectric layer such as SiCN, SiOCN, BN or SiBCN. The spacer material may be deposited by Atomic Layer Deposition, ALD, or Chemical Vapor Deposition, CVD, to cover the structure 100 and be patterned and then etched anisotropically to remain only on the sidewalls of the sacrificial gate 112a, 112b.

As shown in FIG. 1B, the sacrificial gate stacks are arranged in a dielectric layer 116. Some portions of the dielectric layer 116 may form an interlayer dielectric (ILD) surrounding the final gate structures which are to be formed and will be referred to as such in the following. The ILD 116 may be formed subsequent to forming the spacer layers 114. The ILD 116 may be formed in a conventional manner by depositing a dielectric material layer to cover the first region 104 and the second region 106, the first set of fins 108 and the second set of fins 110 therein as well as the sacrificial gate stacks. The dielectric material may be, e.g., $SiO_2$, SiN, $Si_3N_4$ or a low-K dielectric such as SiCN, SiOCN, BN, or SiBCN, to name a few. In some embodiments, the dielectric material may be selected to be of a same material as the spacer layer 114 or of a different material than the spacer layer 114. The dielectric material layer may be planarized by chemical mechanical polishing (CMP), which may be stopped when the upper horizontal surface of the sacrificial gates 112a, 112b are exposed. The CMP may further remove mask portions remaining on top of the sacrificial gates 112a, 112b from the patterning for forming the sacrificial gates 112a, 112b, if such mask portions still are present on the sacrificial gates 112a, 112b.

Figure 1C:
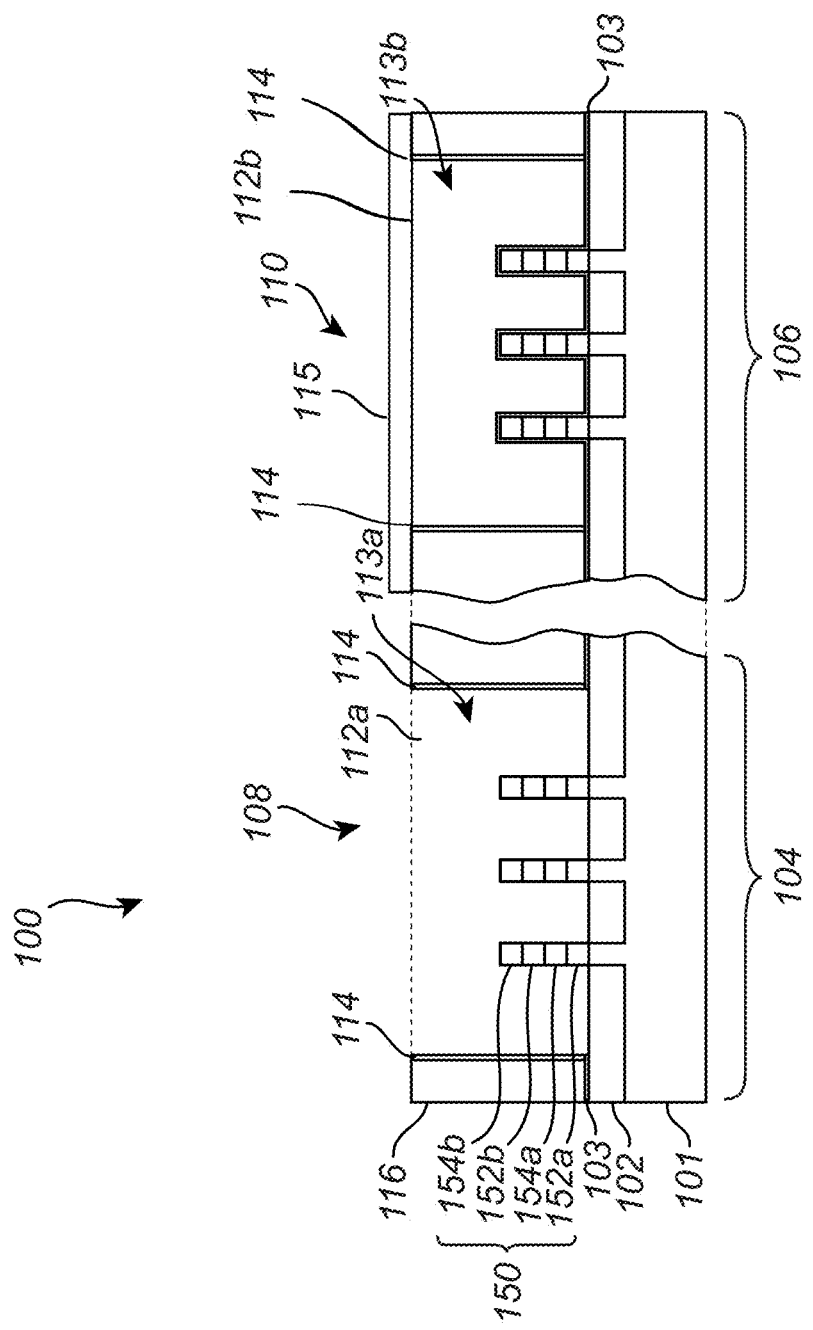

In FIG. 1C, the sacrificial gates 112a, 112b have been removed from the first and the second regions 104, 106 respectively. By removing the sacrificial gates 112a, 112b, a first trench 113a and a second trench 113b are formed in the ILD 116. In other words, a first trench 113a is formed at the position of the previously present first sacrificial gate 112a, and a second trench 113b is formed at the position of the previously present second sacrificial gate 112b. For instance a fluorine- or chloride-based etchant may be used for etching and thus removing the sacrificial gates 112a, 112b in a wet-etch or a dry-etch process such as a RIE process.

When removing the sacrificial gate 112a, 112b, the sacrificial gate dielectric 103 may be exposed within the respective trenches 113a, 113b. More specifically, the sacrificial gate dielectric 103 may be exposed at the bottom surface of the respective trenches 113a, 113b and at a longitudinal section of the first set of fins 108 and at a longitudinal section of the second set of fins 110. In other words, the sacrificial gate dielectric 103 present on the first set of fins 108 and the second set of fins 110 may be exposed along a longitudinal section corresponding to the width of the respective trenches 113a, 113b, i.e., in a direction normal to the cross section of the figures. Also the spacer layer 114 is exposed in the trenches 113a, 113b.

In FIG. 1C, also the sacrificial gate dielectric 103 has been removed from the surfaces exposed in the first trench 113a. In other words, the longitudinal section of the first set of fins 108 in the first trench 113a of the first region 104 is thus exposed. The sacrificial gate dielectric 103 is however still present in the second trench 113b, thus covering the longitudinal section of the second set of fins 110 in the second trench 113b and the bottom surface of the second trench 113b.

The sacrificial gate dielectric 103 may for instance be removed using a dry or wet etching process suitable for etching an oxide stopping at the semiconductor material forming the fins of the first set 108 and the STI 102. During the etching process the second trench 113b is masked to prevent removal of the sacrificial gate dielectric 103 in the second trench 113b. A mask (schematically indicated by 115) may be formed above the second trench 113b. Although the mask 115 is indicated as a layer above the second trench 113b it may be understood that the material forming the mask 115 may be deposited on the sacrificial gate dielectric 103 in the second trench 113b. The mask 115 may be, e.g., a photoresist-based mask. However, other masking materials, e.g., dielectric or polysilicon, may also be used.

Figure 1D:
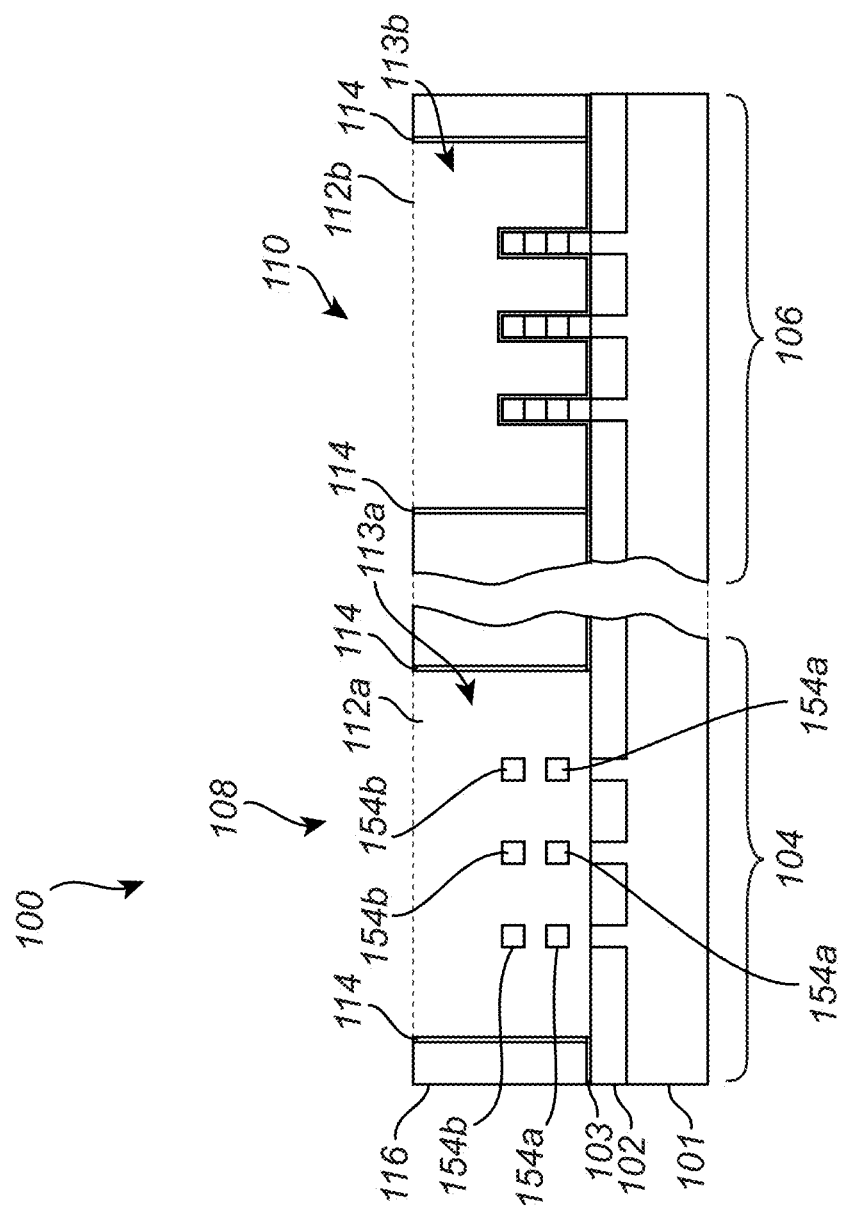

In FIG. 1D, the semiconductor material layers 152a, 152b, e.g., SiGe-based material layers, have been selectively removed from the along the longitudinal section (extending in a longitudinal direction into the page) of the first set of fins 108 exposed in the first trench 113a, the longitudinal section corresponding to the width (in the longitudinal direction into the page) of the trench 113a. By removing the layers 152a, 152b as described, two suspended longitudinal semiconductor features 154a, 154b are formed by the remaining material of each fin 108, e.g., Si-based material, in the first trench 113a. The semiconductor features 154a, 154b so formed are thus suspended within trench 113a along a respective longitudinal section corresponding to the width of the trench 113a. The SiGe material may be removed from the layers 152a, 152b at the longitudinal sections corresponding to the width (in the longitudinal direction into the page) of the trench 113a using a suitable dry or wet etching process which is selective with respect to the SiGe material. For instance, an HCl-based vapor etch may be used.

The sacrificial gate dielectric 103 present in the second trench 113b has consequently masked the second region 106 during the selective removal of the SiGe material from the first set of fins 108, thereby counteracting etching of the second semiconductor feature 110 in the second trench 113b. The second set of fins 110 present in the second region 106 are thus remaining under the sacrificial gate dielectric 103 present in the second trench 113b.

If the mask 115 is present during the etching in the first trench 113a the mask 115 may, depending on the type of mask, either be consumed during the etching, or if formed of a material which can withstand the etching process used for etching the SiGe material, mask the second region 106 separately, or in combination with the sacrificial gate dielectric 103 in the second trench 113b.

Alternatively, Si material layers may be removed from the longitudinal section of the first set of fins 108 exposed in the first trench 113a using a conventional etching process which is selective with respect to the Si material.

Figure 1E:
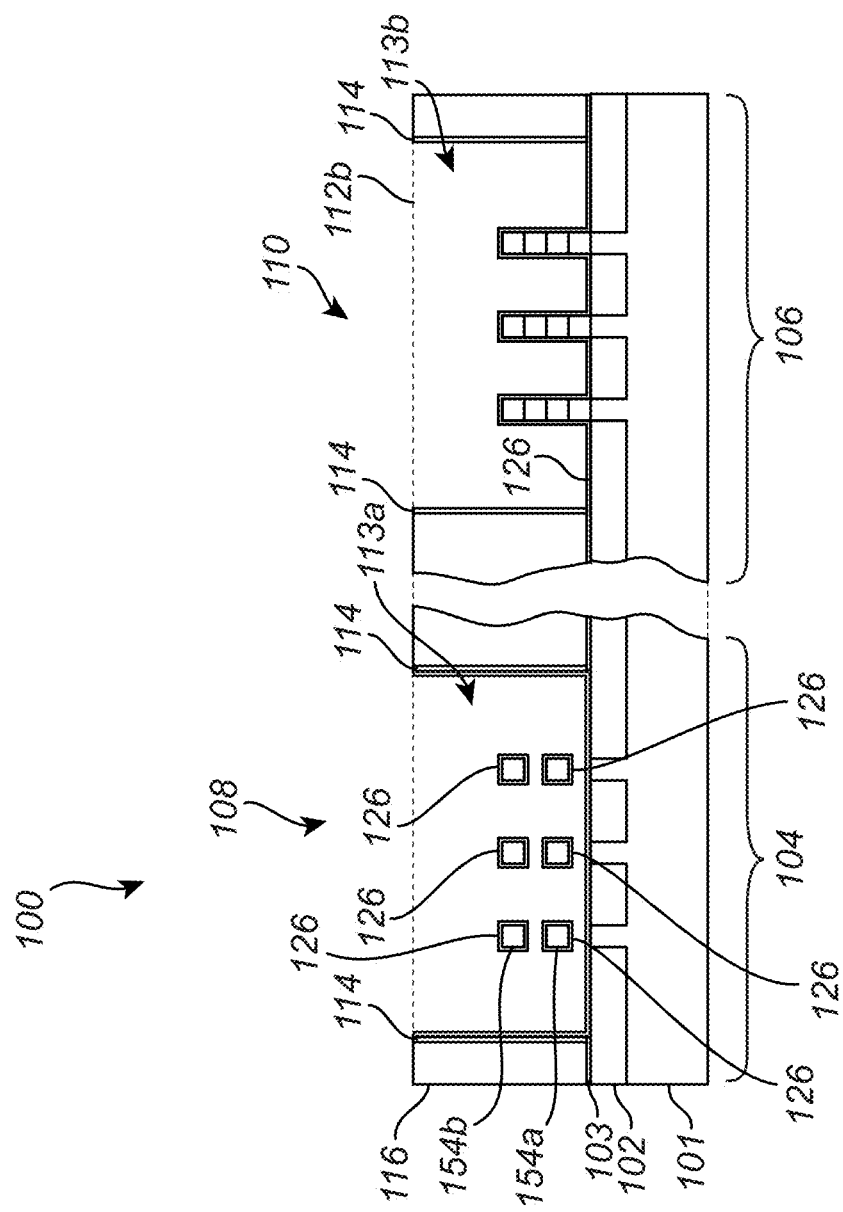

In FIG. 1E, a gate dielectric layer 126 has been formed in the first and second trenches 113a, 113b. More specifically, the gate dielectric 126 has been formed on the remaining Si layers 154a, 154b in the first trench 113a, on the second set of fins 110 in the second trench 113b and on sidewalls the bottom and the sidewalls of the first and second trenches 113a, 113b.

The gate dielectric 126 may be formed of a high-K dielectric material having a dielectric constant greater than that of $SiO_2$ (about 3.9), for instance $HfO_2$, $ZrO_2$, $Al_2O_3$, $La_2O_3$, $Gd_2O_3$, or mixtures thereof, or other rare-earth oxides or metal oxide silicates such as $HfSiO_x$, $YSiO_x$, or $LaSiO_x$. The gate dielectric layer 126 may be formed by one layer of a high-K dielectric material or by a stack of different high-K dielectric materials. The one or more material layers forming the gate dielectric 126 may be deposited for instance by ALD.

In FIG. 1E, also the sacrificial gate dielectric 103 has been removed from the surfaces exposed in the trench 113b prior to forming the gate dielectric 126. The gate dielectric 126 may thus be formed directly on the second set of fins 110.

As an alternative, the sacrificial gate dielectric 103 need not be removed prior to forming the gate dielectric 126. In this case, two dielectric layers (not shown) will be present on top of each other in the second trench 113b.

Figure 1F:
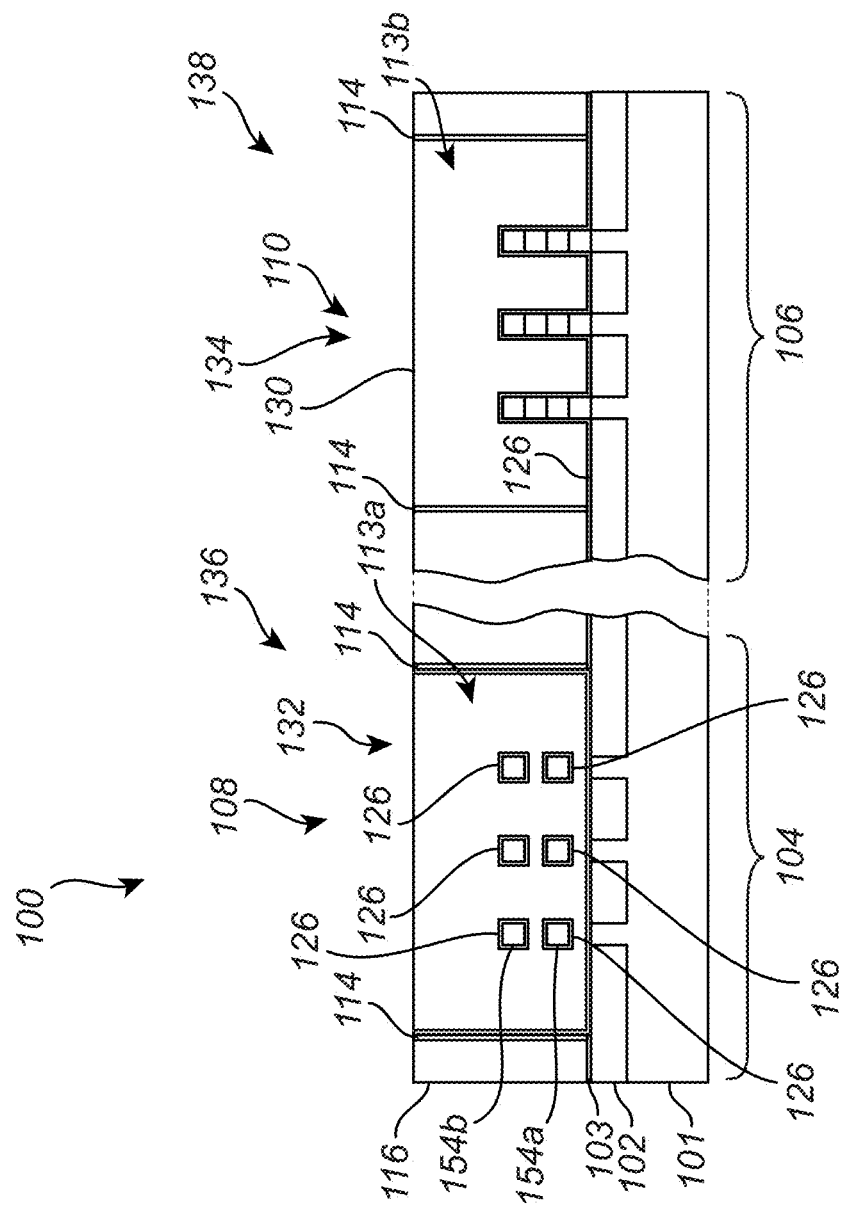

In FIG. 1F, a first gate conductor 128 has been formed in the first trench 113a on the gate dielectric layer 126, and a second gate conductor 130 has been formed in the second trench 113b on the gate dielectric layer 126. The first gate conductor 128 is filling the first trench 113a, thus enclosing the two previously suspended longitudinal semiconductor features 154a, 154b in the first trench 113a. In other words, a gate all gate-all-around stack 132 has been formed on the previously suspended longitudinal semiconductor features 154a, 154b. The gate stack 132 thus includes the gate dielectric 126 and the first gate conductor 128. A first semiconductor device 136 in the form of a GAAFET has hence been formed in the first region 104.

The second gate conductor 130 is filling the second trench 113b, thus covering the second set of fins 110 in the second trench 113b. In other words, a gate stack 134 has been formed on the longitudinal section of the second set of fins 110 in the second trench 113b. The gate stack 134 thus includes the gate dielectric 126 and the second gate conductor 130. A second semiconductor device 138 in form of a finFET has hence been formed in the second region 106.

The first gate conductor 128 and the second gate conductor 130 may be formed by a single metal layer. The first gate conductor 128 and the second gate conductor 130 may also be formed by a stack of two or more metal layers. The single layer, or each layer of the stack, may be deposited by ALD as a respective conformal layer covering the structure 100, also the upper surface of the structure 100. Portions of the metal layer(s) deposited outside of the first or second trench 113, 113b may be removed by CMP. Examples of gate conductor materials include single metals or alloys of Ti, W, Ta and Al.

The first gate conductor 128 and the second gate conductor 130 may be formed simultaneously using the same material or materials, or the first gate conductor 128 and the second gate conductor 130 may be formed using different materials.

The method may further comprise forming of source and drain electrodes on source and drain regions of the semiconductor features 154a, 154b. The source and drain regions may be formed in respective portions of the remaining fin structures, on opposite sides of the suspended longitudinal sections including the semiconductor features 154a, 154b. The source and drain regions may accordingly be formed on opposite sides of the gate stack 132 (as viewed along the longitudinal dimension of the fins). Prior to formation of source and drain electrodes, the source and drain regions may be subjected to ion implantation. Source and drain electrodes may be formed in a corresponding manner on the second set of fins 110, on opposite sides of the gate stack 134.

Figure 2A:
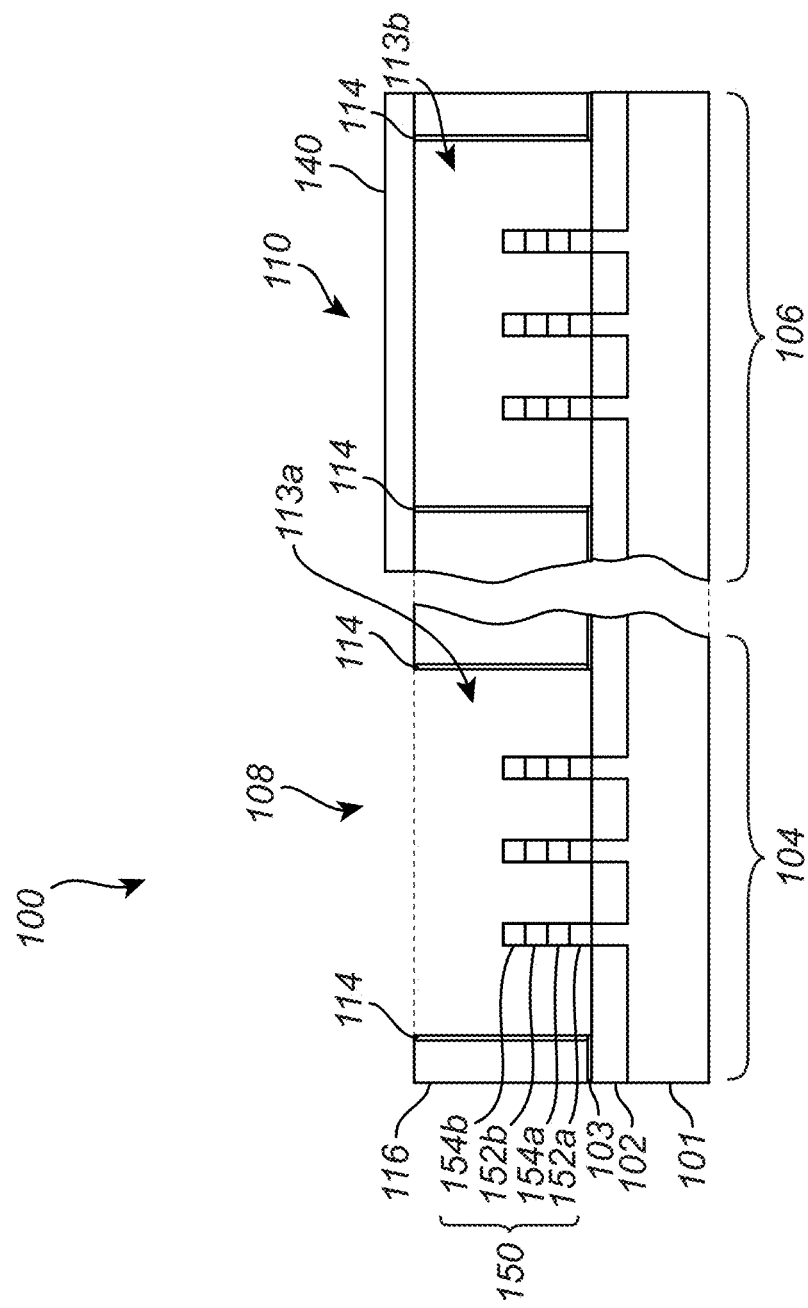
FIG. 2A-2B are a plane section views of the substrate of FIG. 1, taken along the front section of FIG. 1A, when processed according to an alternative method.

Now referring to FIG. 2A, here is conceptually depicted a semiconductor structure 100 processed according to a variation of the above described method. FIG. 2A is similar to FIG. 1C, owing from that the semiconductor structure 100 of FIG. 2A may be processed as described above in conjunction with FIGS. 1A-C to arrive at the semiconductor structure 100 of FIG. 2A. The following differences do however exist between the semiconductor structure 100 of FIG. 2A and the semiconductor structure 100 of FIG. 1C.

A mask 140 has been formed above the second trench 113b in FIG. 2A. The mask 140 is covering and thus sealing off the interior of the second trench 113b. The mask 140 may consequently act as an etch mask 140 to counteract or prevent etching in the second trench 113b, while etching may occur in the first trench 113a.

Further, in FIG. 2A, the sacrificial gate dielectric 103 has been removed in the second trench 113b, and not only in the first trench 113a as in FIG. 1C. More specifically, the sacrificial gate dielectric 103 has been removed from the surfaces exposed in the second trench 113b prior to forming the mask 140, and preferably simultaneously as when removing the sacrificial gate dielectric 103 in the first trench 113a. The removal of the sacrificial gate dielectric 103 may be conducted as described above in conjunction with FIG. 1C.

The mask 140 may be formed using any suitable techniques. For instance, the mask 140 may be formed using conventional photolithographic processes. Such photolithographic processes may for instance make use of negative or positive photoresists as is known in the art.

It is to be noted that the mask 140 is drawn in simplified manner, where the mask 140 is only present above the second trench 113b. However, the mask 140 may partly or completely fill the second trench 113b e.g. depending on the mask material and process used for forming the mask.

Figure 2B:
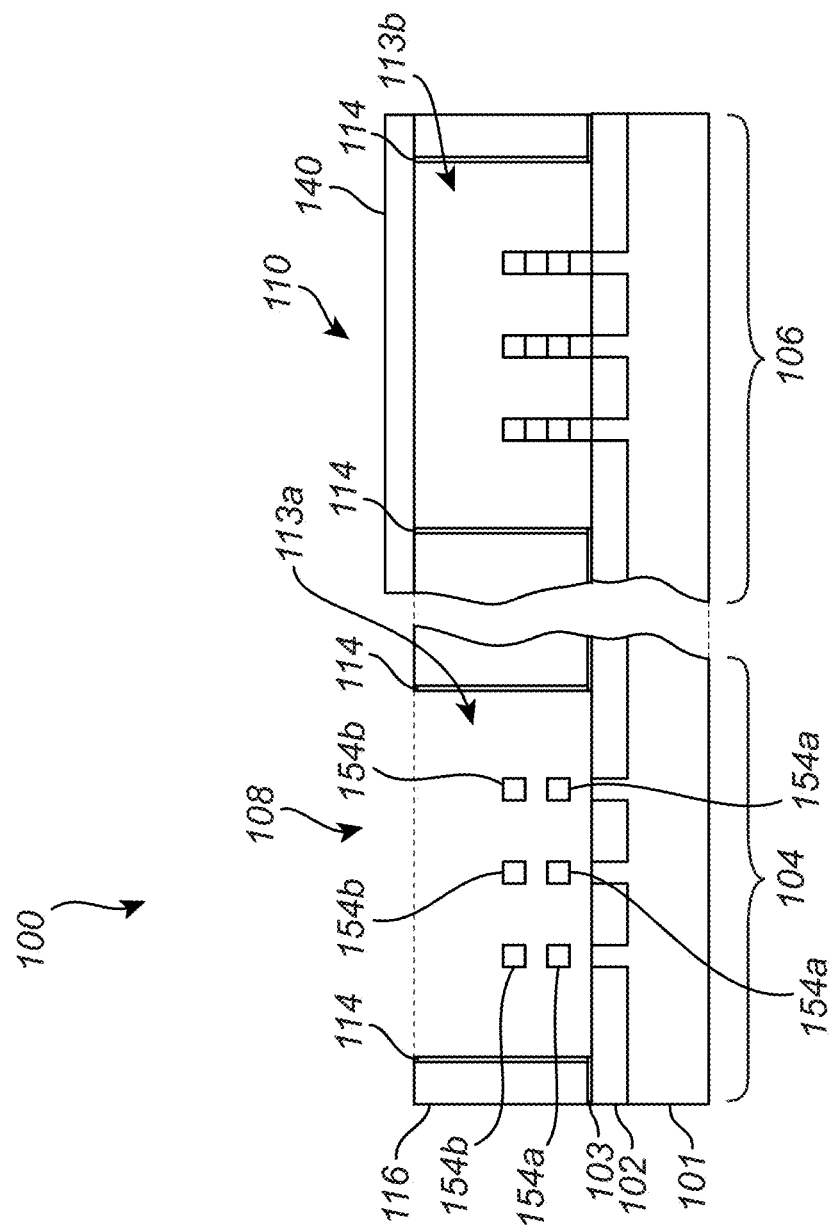

In FIG. 2B, the SiGe material layers 152a, 152b have been selectively removed from the longitudinal section of the first set of fins 108 exposed in the first trench 113a, as described above in conjunction to FIG. 1D. While removing the SiGe material, the mask 140 has acted as an etch mask 140 and counteracted etching in the second trench 113b. In other words, the mask 140 has fulfilled the same purpose as the sacrificial gate dielectric 103 present in the second trench 113b of FIGS. 1C-1D.

After the SiGe material has been selectively removed from the layers 152a, 152b from the longitudinal section of the first set of fins 108 exposed in the first trench 113a, the mask 140 may be removed using any suitable technique. The removal of the mask 140 may for example be conducted using a remover solution or an oxygen based gas plasma as is known in the art. The processing of the semiconductor structure 100 may then continue as described above in conjunction with FIGS. 1E-1F.

Subsequent to forming the intermediate as illustrated in FIG. 1F which may complete a front end of the line (FEOL) processing of the semiconductor device, the intermediate structure may be further processed to form various other features, e.g., electrical connections to the gate electrodes and source and drain regions, including back end of the line (BEOL), thereby forming the final semiconductor device, which includes a GAAFET in the first region and a finFET in the second region. One of the first and second regions, may form a logic core of the semiconductor device, and the other of the first and second regions may form an IO device. For example, where the logic core has transistors are further scaled relative to the I/O device, the first region may comprise the GAAFET that form transistors of the logic core, while the second region may comprise the finFET that form transistors of the I/O device. However, embodiments are not so limited, and in other embodiments, the first region may comprise the finFET in lieu of or in addition to the GAAFET to form transistors of the logic core, and/or the second region may comprise the GAAFET in lieu of or in addition to finFET to form transistors of the I/O device.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

What is claimed is:

1. A method of forming field effect transistors, the method comprising:
    forming in a first region of a substrate a first semiconductor feature and forming in a second region of the substrate a second semiconductor feature, wherein each of the first and second semiconductor features is formed in a dielectric layer and comprises a fin-shaped semiconductor feature including a vertical stack of at least a first semiconductor material layer and a second semiconductor material layer formed over the first semiconductor material layer;
    forming a first sacrificial gate stack including a sacrificial gate and a sacrificial gate dielectric on a longitudinal section of the first semiconductor feature;
    forming a second sacrificial gate stack including a sacrificial gate and a sacrificial gate dielectric on a longitudinal section of the second semiconductor feature;
    removing the sacrificial gate of the first sacrificial gate stack and the sacrificial gate of the second sacrificial gate stack, thereby forming a first trench and a second trench in the dielectric layer, the first trench exposing the sacrificial gate dielectric along the longitudinal section of the first semiconductor feature and the second trench exposing the sacrificial gate dielectric along the longitudinal section of the second semiconductor feature;
    forming a mask over the second trench;
    removing the sacrificial gate dielectric in the first trench, thereby exposing the longitudinal section of the first semiconductor feature in the first trench, wherein the mask formed over the second trench prevents etching of the sacrificial gate dielectric in the second trench during the removal of the sacrificial gate dielectric in the first trench;
    selectively etching to remove the first semiconductor material layer along the longitudinal section of the first semiconductor feature to form a suspended longitudinal first semiconductor feature of a remaining second semiconductor material layer, while masking the second region to prevent etching of the second semiconductor feature;
    forming a gate-all-around electrode surrounding the suspended longitudinal first semiconductor feature in the first region; and
    forming a gate electrode on the fin-shaped second semiconductor feature in the second region.

2. The method according to claim 1, wherein forming the gate-all-around electrode on the suspended longitudinal first semiconductor feature includes depositing a first gate conductor in the first trench, and wherein forming the gate electrode on the fin-shaped second semiconductor feature includes depositing a second gate conductor in the second trench.

3. A method of forming field effect transistors, the method comprising:
- forming in a first region of a substrate a first semiconductor feature and forming in a second region of the substrate a second semiconductor feature, wherein each of the first and second semiconductor features is formed in a dielectric layer and comprises a fin-shaped semiconductor feature including a vertical stack of at least a first semiconductor material layer and a second semiconductor material layer formed over the first semiconductor material layer;
- forming a first sacrificial gate stack including a sacrificial gate and a sacrificial gate dielectric on a longitudinal section of the first semiconductor feature;
- forming a second sacrificial gate stack including a sacrificial gate and a sacrificial gate dielectric on a longitudinal section of the second semiconductor feature;
- removing the sacrificial gate of the first sacrificial gate stack and the sacrificial gate of the second sacrificial gate stack, thereby forming a first trench and a second trench in the dielectric layer, the first trench exposing the sacrificial gate dielectric along the longitudinal section of the first semiconductor feature and the second trench exposing the sacrificial gate dielectric along the longitudinal section of the second semiconductor feature;
- removing the sacrificial gate dielectric in the first trench, thereby exposing the longitudinal section of the first semiconductor feature in the first trench;
- selectively etching to remove the first semiconductor material layer along the longitudinal section of the first semiconductor feature to form a suspended longitudinal first semiconductor feature of a remaining second semiconductor material layer, while masking the second region to prevent etching of the second semiconductor feature;
- subsequent to forming the suspended longitudinal first semiconductor feature in the first trench, removing the sacrificial gate dielectric in the second trench;
- forming a gate-all-around electrode surrounding the suspended longitudinal first semiconductor feature in the first region; and
- forming a gate electrode on the fin-shaped second semiconductor feature in the second region.

4. The method according to claim 1, further comprising, prior to forming the gate-all-around electrode and the gate electrode, depositing a gate dielectric in the first trench on the longitudinal section of the suspended longitudinal first semiconductor feature.

5. The method according to claim 1, further comprising, prior to forming the gate-all-around electrode and the gate electrode, depositing a gate dielectric in the second trench on the longitudinal section of the second semiconductor feature.

6. The method according to claim 1, wherein the first semiconductor material layer is formed of a SiGe-based material and the second semiconductor material layer is formed of a Si-based material.

7. The method according to claim 1, wherein the first semiconductor material layer is formed of a Si-based material and the second semiconductor material layer is formed of a SiGe-based material.

8. The method according to claim 1, further comprising forming source and drain regions in the first semiconductor feature to form a gate-all-around field effect transistor (GAAFET), and forming source and drain regions in the second semiconductor feature to form a fin field effect transistor (FinFET).

9. The method according to claim 3, wherein forming the gate-all-around electrode on the suspended longitudinal first semiconductor feature includes depositing a first gate conductor in the first trench, and wherein forming the gate electrode on the fin-shaped second semiconductor feature includes depositing a second gate conductor in the second trench.

10. The method according to claim 3, further comprising, prior to forming the gate-all-around electrode and the gate electrode, depositing a gate dielectric in the first trench on the longitudinal section of the suspended longitudinal first semiconductor feature.

11. The method according to claim 3, further comprising, prior to forming the gate-all-around electrode and the gate electrode, depositing a gate dielectric in the second trench on the longitudinal section of the second semiconductor feature.

12. The method according to claim 3, wherein the first semiconductor material layer is formed of a SiGe-based material and the second semiconductor material layer is formed of a Si-based material.

13. The method according to claim 3, wherein the first semiconductor material layer is formed of a Si-based material and the second semiconductor material layer is formed of a SiGe-based material.

14. The method according to claim 3, further comprising forming source and drain regions in the first semiconductor feature to form a gate-all-around field effect transistor (GAAFET), and forming source and drain regions in the second semiconductor feature to form a fin field effect transistor (FinFET).

* * * * *